Figure 1:
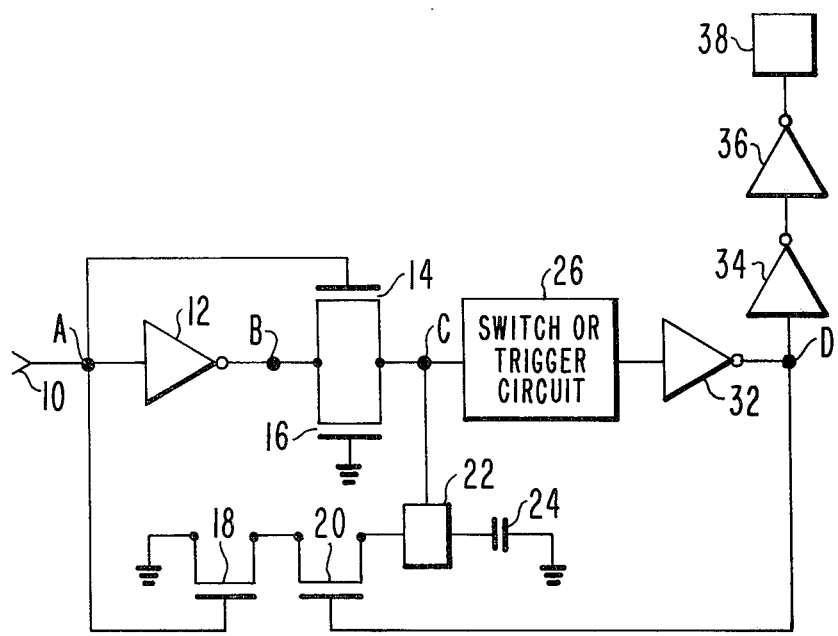

United States Patent [19]

Kirschner

[11] 4,125,815

[45] Nov. 14, 1978

[54] PHASE LOCK LOOP INDICATOR

[75] Inventor: Barry A. Kirschner, Pittstown, N.J.

[73] Assignee: RCA Corporation, New York, N.Y.

[21] Appl. No.: 846,198

[22] Filed: Oct. 27, 1977

[51] Int. Cl.² .............................................. H03B 3/04
[52] U.S. Cl. .......................................... 331/8; 331/64
[58] Field of Search ............... 331/1, 64, 8; 324/83 D; 328/155

[56] References Cited

U.S. PATENT DOCUMENTS

| 3,080,533 | 3/1963 | Edwards | 331/64 |
| 3,393,325 | 7/1968 | Borror et al. | 307/205 |
| 3,702,945 | 11/1972 | Faith et al. | 307/251 |
| 3,842,411 | 10/1974 | Naito | 307/251 |
| 4,039,858 | 8/1977 | Stewart | 307/231 |

OTHER PUBLICATIONS

RCA Appl. Note ICAN-6101, Morgan & Steudel, 10-1972.

*Primary Examiner*—John Kominski
*Attorney, Agent, or Firm*—H. Christoffersen; A. L. R. Limberg; L. P. Benjamin

[57] ABSTRACT

A dual time constant, phase lock loop indicator is described which will respond in one manner to signals indicating an "unlocked" condition and respond in another, different manner to signals indicating a "locked" condition.

7 Claims, 2 Drawing Figures

PHASE LOCK LOOP INDICATOR

This invention relates to phase lock loop detector circuitry and more particularly to an improved lock circuit detector which will allow a utilization device, driven by a phase lock loop circuit, to be operational only when the phase lock loop circuit is in a locked condition.

The basic phase-locked-loop (PLL) system usually consists of at least three elements and includes a voltage controlled oscillator (VCO), a phase comparator and a low pass filter. The VCO has its output applied as one input to the phase comparator, the other input of which is supplied by an external signal source, which may be a reference voltage or signal. The output of the phase comparator is applied to the low pass filter (LPF) and, to complete the loop, the output of the LPF is applied as an input to the VCO. Thus, all elements are connected to form a closed loop, feedback system.

In a known form of PLL, when no externally generated signals are applied to the PLL system, the output of the phase comparator (an error signal) is zero, as is the output of the LPF (control voltage). With a zero control voltage applied to the VCO, the VCO is caused to operate at its center or design frequency. When a signal is applied to the phase comparator, from the external source, the phase comparator compares the phase and frequency of the applied signal with the phase and frequency of the VCO and an output error signal is generated that is proportional to the difference in phase between the input and VCO signals. The error signal is then filtered by the LPF and applied to the VCO as an input, to vary or adjust the VCO output in a direction that reduces the phase and frequency difference between the VCO and the input signal applied to the phase comparator. This process is continuous until such time as the VCO frequency and the applied input signal assume a locked phase relationship.

In certain applications, it is imperative to know when the external oscillator is "locked," in order to operate the device driven by the oscillator. One example of such use is found in the Class D or Citizen Band transceiver where the user is limited to receiving and transmitting on a discrete number of closely spaced channels, each of which occupies only a relatively narrow bandwidth. Thus, when one must change from one channel to another, it is both necessary and desirable that there be some "indicator" or output signal that will signify when the PLL circuit is "unlocked," in order to disable the transceiver and avoid any transmissions on the unauthorized, interchannel frequencies. Conversely, some indication is also desirable to show when the PLL circuit is "locked," in order to enable the transceiver and allow transmissions. One of the simplest forms of "indicator" or output signal is a binary signal where, for example a "1" or a "0" output from the lock indicator would correspond to a "locked" or "unlocked" condition respectively. Thus, the presence of the binary "1" could be used to activate a utilization circuit that requires the PLL signal, while the presence of the binary "0" will be used to maintain the utilization circuit in an inactive state.

As will hereinafter be used, the convention arbitrarily adopted to aid in both the foregoing and ensuing explanation is that the most positive voltage used in the lock detection system is represented by the binary digit 1 (also referred to as "high" or "hi") and the least positive voltage is represented by the binary digit 0 (also referred to as "low" or "lo").

One example of an "indicator" circuit is shown in the RCA Application Note ICAN 6101 dated October, 1972 and entitled "The RCA COS/MOS Phase-Locked-Loop a Versatile Building Block for Micro-Power Digital and Analog Applications" by D. Morgan and G. Steudel. This scheme utilizes a parallel connected combination of diode and resistor, with a shunt capacitor to achieve lock detection and present a binary "1" or "0" to signify a "locked" or "unlocked" condition.

The present invention is embodied in a pair of impedances whose characteristics have been tailored to respond rapidly to either a low or "0" input signal or to a high or "1" input signal.

IN THE DRAWINGS

Figure 2:
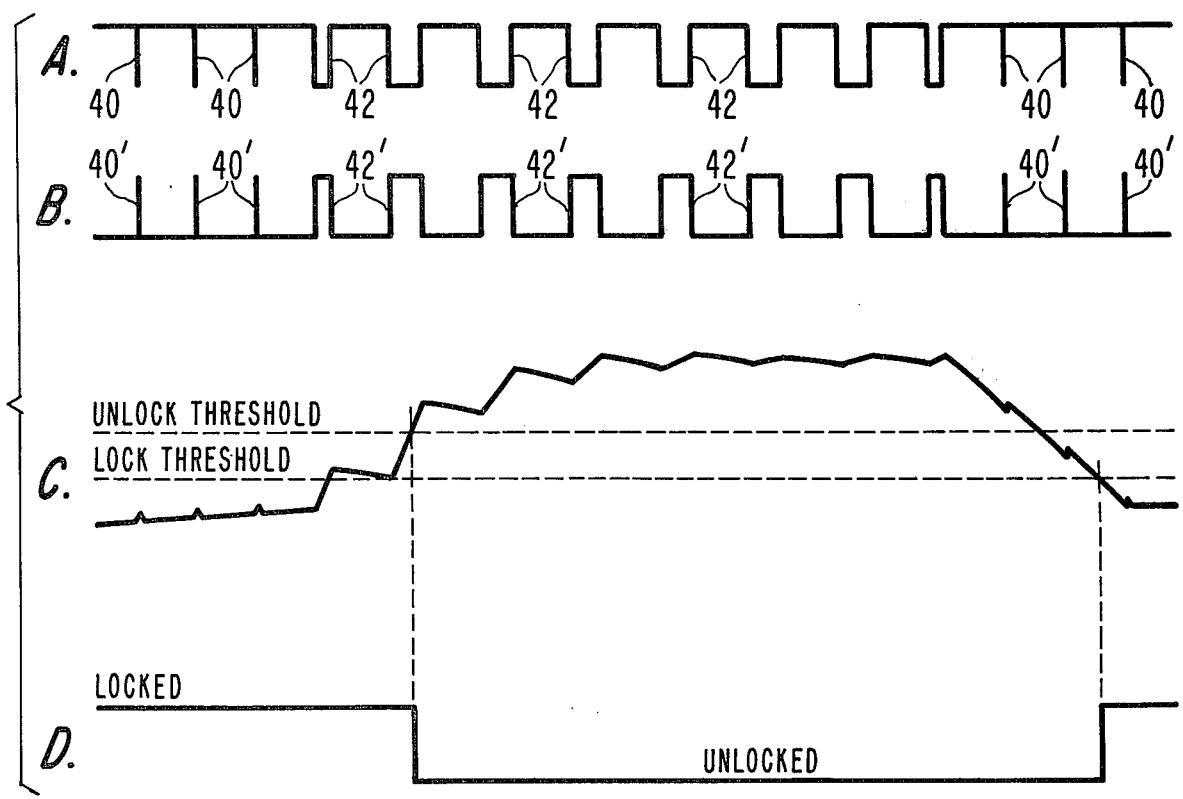

FIG. 1 is a schematic diagram of a novel phase lock loop indicator circuit combining the principles of this invention; and FIG. 2 is a timing diagram which, when taken in conjunction with the schematic representation of FIG. 1, further characterizes this invention.

Referring now to FIGS. 1 and 2, there is shown input terminal 10 to which is applied any error signal that may appear at the output of the phase comparator (not shown), in the typical phase lock loop circuit. As previously stated, the error signal appearing at the output of the phase comparator represents the comparison of the phase of the VCO with the phase of the applied signal and is proportional to the difference in phase between the input and the VCO signals. This error signal appearing at the input terminal 10, is shown in diagram A of FIG. 2. The in-phase or "locked" signals appear on timing diagram A as negative-going spikes 40, while out-of-phase signals appear as pulses 42 having a finite width. These signals are then passed through inverter 12 where they are inverted to now appear at node B as shown in timing diagram B of FIG. 2. The output of inverter 12 (diagram B) is applied to a pair of p-channel enhancement mode transistors 14 and 16 which have their conduction paths connected in parallel. The gate of p-channel device 16 is connected to ground (or other source of reference potential) while the gate of p-channel device 14 is connected to input terminal 10 so as to drive transistor 14 into conduction whenever any pulses of finite width (out-of-phase condition) appear at input 10. The output of parallel connected p-channel transistors 14 and 16 are connected to node C which, in turn, is connected to pad 22. Pad 22 is provided with an external capacitor 24 that is connected to the pad and ground. It should be noted that p-channel device 14 has been tailored to have a relatively low impedance when driven into conduction, that is, it has a relatively short channel-length-to-channel width dimension. By way of example, the transistor 14 may have a channel length of about 0.5 mil and a channel width of about 1.0 mil. P-channel transistor 16, on the other hand, has been tailored to have a higher impedance than the impedance of p-channel transistor 14 by having been provided with a relatively longer channel length and a higher length-to-width ratio than that of transistor 14. For example, p-channel transistor 16 may have a channel length of about 5.0 mils and a channel width of about 0.5 mil. Thereafter, the signal appearing in the node C (diagram C, FIG. 2) is applied to switch or trigger circuit 26. The output of switch or trigger circuit 26 is then applied to inverter 32, the output of which is the basic "locked" or "unlocked" signal appearing at node D (diagram D, FIG. 2).

It should be noted that switch or trigger circuit 26 may be any type circuit having hysteresis and one having an output that is switched from a first state to a second state by an input signal at a first level, and switched from the second state back to the first state by another input signal at a second level. The rise and fall time of the switch or trigger is shorter than that of a conventional multivibrator (although certain multivibrator circuits, under certain circumstances may be used). Further, the wave-shape of the output signal is independent of the input wave-shape. One such switch or trigger circuit that may be successfully utilized is a squaring circuit known as a Schmitt trigger such as the RCA CA 3002 shown in FIGS. 104 and 118 of the Technical Series IC-41 entitled "RCA Linear Integrated Circuits" (1967). In the configuration of FIG. 1, p-channel device 16 is always biased to a conductive state while p-channel device 14 is only biased to a conductive state when out-of-phase pulses appear at input terminal 10.

Regarding the operation of the circuit during a locked condition (When pulses 40 appear at terminal 10), only p-channel device 16 will be conducting, and external capacitor 24, connected to pad 22, will be discharged to ground through high impedance device 16 and inverter 12. It should be noted that by using p-channel devices, an improvement is achieved, in that as the capacitor 24 discharges, the substrate effect on p-channel device 16 increases. This is due to the fact that the source potential of transistor 16 drops below $V_{DD}$, to effectively increase the impedance of p-channel device 16 as capacitor 24 discharges. The net effect is to make it more difficult for capacitor 24 to discharge to the lock threshold point of operation of trigger circuit 26, where a "locked" condition will be triggered and indicated as node D. For a more detailed explanation of "substrate effect" or "substrate bias," the readers' attention is directed to "MOSFET in Circuit Design" by R. H. Crawford (1967) pages 40–44.

To complete the circuit, a feedback loop, comprising a pair of n-channel devices 18 and 20, is provided wherein the conduction paths or channels of devices 18 and 20 are connected in series between node C and ground, or other point of reference potential. The gate of n-channel device 18 is connected to node A while the gate of n-channel device 20 is connected to node D. N-channel devices 18 and 20 are used primarily as an auxiliary discharge or pulldown means for capacitor 24. It has been found that capacitor 24 will not discharge below 1 p-threshold when discharging only through p-channel device 16. The presence of this residual charge will be signaled to node D as a lock indication which then serves to make n-channel device 20 conductive. Since n-channel device 18 is biased on due to the absence of signals having a finite width at input 10 (indicating an in-phase error signal), n-channel device 18 conducts and the series combination of conductive transistors 18 and 20 will pull the capacitor down to ground or other reference potential. It should be noted that it is desired to have the impedances of n-channel device 18 and 20 sufficiently high and, preferably, higher than the impedances of p-channel device 16 so that capacitor 24 may be properly charged whenever the error signal appearing at node A indicates an out-of-phase condition at the output of a phase comparator.

If now a low or finite width signal (pulses 42, FIG. 2A) appears at node A, p-channel device 14 becomes conductive and the signal (pulses 42', FIG. 2B) at node B goes high. This causes capacitor 24 to charge rapidly through both p-channel devices 14 and 16. When the error signal at node A is high (pulses 40, FIG. 2A), p-channel device 14 is cut-off and capacitor 24 discharges slowly through p-channel device 16 and inverter 12, with n-channel device 18 and 20 completing the pulldown as previously described. As shown in the timing diagram of FIG. 2, input 10 is normally high when the phase comparator indicates a locked condition. This is indicated by the negative-going spikes 40. However, the duration of these spikes 40 is insufficient to charge capacitor 24 to the lock threshold of trigger circuit 26. It is only when the error signal at input 10 is in the out-of-lock condition that pulses of finite width 42 appear and it is these negative-going pulses (as distinguished from the in-lock spikes) that allows capacitor 24 to become charged above the "lock" threshold. As will be obvious to those skilled in the art, it takes a number of cycles, in the locked condition, before the capacitor discharges sufficiently to indicate a locked condition.

In order to present a completely functional device, series inverters 34 and 36 are connected between node D and output pad 38 in order to buffer the "locked" or "unlocked" signal appearing at node D from any utilization device or circuit (not shown) that may be connected to output pad 38.

What is claimed is:

1. In a phase lock loop system having a voltage controlled oscillator, a reference signal, a phase comparator and a low pass filter connected as a closed loop, feedback system, the phase comparator comparing the phases of the voltage controlled oscillator and reference signals to generate at the output thereof a signal that is proportional to any difference in phase between the voltage controlled oscillator and the reference signals, an indicator circuit for the phase lock loop system, comprising:

a common node;
   capacitor means connected between the common node and a point of reference potential;
   first impedance means, connected between the common node and the phase comparator output and conductive only when the phase comparator generates a first output signal signifying an out-of-lock condition between the voltage controlled oscillator and the reference signal, to charge the capacitor and indicate an unlocked relationship therebetween; and
   second, conductive impedance means connected between the common node and the phase comparator output, to discharge the capacitor means and provide a signal indicative of a locked relationship therebetween only when the comparator generates a second output signal signifying an in-phase condition between the voltage controlled oscillator and the reference signals.

2. The indicator circuit of claim 1 wherein:
   the first and second impedance means are transistors of the same first conductivity type, each having first and second electrodes with a controlled conduction path therebetween and a control electrode; and
   the first and second electrodes of the first transistor connected respectively to the first and second electrodes of the second transistor.

3. The indicator circuit of claim 2 further comprising:
an input terminal;
means applying the phase comparator output signal to both the input terminal and to the control electrode of the first transistor to render the first transistor conductive only for the duration of the first output signal; and
means connecting the control electrode of the second transistor to the source of reference potential, to render the second transistor continuously conductive.

4. The indicator circuit of claim 3 further comprising:
an output terminal; and
a trigger circuit connected between the output terminal and the common node and operable by the charge on the capacitor, for providing a first output therefrom when the capacitor is charged above a first level, to indicate the unlocked relationship, and for providing a second output therefrom when the capacitor is discharged below a second level, to indicate the locked relationship.

5. The indicator circuit of claim 4 further comprising:
an auxiliary capacitor discharge circuit for completely discharging the capacitor below the second level during the locked relationship; and
means connecting the discharge circuit between the common node and the point of reference potential.

6. The indicator circuit of claim 5 wherein the auxiliary discharge circuit is a feedback loop comprising:
third and fourth impedance means serially connected between the common node and the point of reference potential; and
means driving both the third and four impedance means into conduction only on the simultaneous occurrence of the second output at the output terminal and an in-phase input at the input terminal.

7. The indicator circuit of claim 6 wherein:
the third and fourth transistors are the same, second conductivity type, each having first and second electrodes with a controlled conductive path therebetween and a control electrode;
the first and second electrodes of the third and fourth transistors are connected in series between the common node and the point of reference potential;
the control electrode of the third transistor is connected to the output terminal; and
the control electrode of the fourth transistor is connected to the input terminal.

* * * * *